United States Patent
Lee et al.

(10) Patent No.: US 10,775,412 B2
(45) Date of Patent: Sep. 15, 2020

(54) PROBE CARD TESTING DEVICE AND TESTING DEVICE

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 30 days.

(21) Appl. No.: 16/404,261

(22) Filed: May 6, 2019

(65) Prior Publication Data
US 2020/0088764 A1 Mar. 19, 2020

(30) Foreign Application Priority Data
Sep. 19, 2018 (TW) .............................. 107133003 A

(51) Int. Cl.
*G01R 1/073* (2006.01)
*G01R 1/04* (2006.01)

(52) U.S. Cl.
CPC ....... *G01R 1/07342* (2013.01); *G01R 1/0416* (2013.01)

(58) Field of Classification Search
CPC .......................... G01R 1/07342; G01R 1/0416
USPC .................................................. 324/754.07
See application file for complete search history.

(56) References Cited

U.S. PATENT DOCUMENTS

| | | | | |
|---|---|---|---|---|
| 3,842,189 A * | 10/1974 | Southgate | ............ | H05K 7/1061 174/547 |
| 7,247,035 B2 * | 7/2007 | Mok | ....................... | C23C 18/00 439/66 |
| 8,179,692 B2 * | 5/2012 | Ihara | .................... | H05K 3/4015 361/787 |
| 8,969,735 B2 * | 3/2015 | Chow | ................. | H01L 23/5385 174/261 |

* cited by examiner

*Primary Examiner* — Reena Aurora
(74) *Attorney, Agent, or Firm* — Li & Cai Intellectual Property (USA) Office

(57) ABSTRACT

A probe card testing device includes a testing circuit board, a signal transmission board, an electrical connecting module, and a probe head. The testing circuit board has metal pads spaced apart from each other. The signal transmission board has internal pads arranged on a bottom surface thereof and spaced apart from each other. The electrical connecting module includes a spacer having thru-holes and elastic arms positioned on the spacer. The spacer is sandwiched between the testing circuit board and the signal transmission board. The metal pads respectively face the internal pads through the thru-holes. A part of each elastic arm is arranged in one of the thru-holes, and is detachably compressed by one of the metal pads and the corresponding internal pad so as to be elastically deformed to establish an electrical transmission path. The probe head is disposed on a top surface of the signal transmission board.

10 Claims, 8 Drawing Sheets

PROBE CARD TESTING DEVICE AND TESTING DEVICE

CROSS-REFERENCE TO RELATED PATENT APPLICATION

This application claims the benefit of priority to Taiwan Patent Application No. 107133003, filed on Sep. 19, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing device, and more particularly to a probe card testing device and a testing device each establishing an electrical connection between components thereof without any soldering material.

BACKGROUND OF THE DISCLOSURE

A conventional testing device includes a testing circuit board electrically coupled to a testing machine and a signal transmission board disposed on the testing circuit board. The signal transmission board of the conventional testing device is soldered onto the testing circuit board. However, in the soldering process of the signal transmission board and the testing circuit board, the conventional testing device is easily damaged by thermal shock. Moreover, the signal transmission board and the testing circuit board fixed to each other by soldering are inconvenient for subsequent inspection and repair.

SUMMARY OF THE DISCLOSURE

In response to the above-referenced technical inadequacies, the present disclosure provides a probe card testing device and a testing device to effectively improve the issues associated with conventional testing devices.

In one aspect, the present disclosure provides a probe card testing device, which includes a testing circuit board, a signal transmission board, an electrically connecting module, and a probe head. The testing circuit board includes a plurality of metal pads spaced apart from each other. The testing circuit board is configured to be electrically coupled to a testing machine. The signal transmission board has a top surface and a bottom surface opposite to the top surface. The bottom surface of the signal transmission board faces the testing circuit board along a thickness direction, and the signal transmission board includes a plurality of internal pads arranged on the bottom surface thereof. The electrically connecting module is sandwiched between the testing circuit board and the signal transmission board, and the electrically connecting module includes a spacer and plurality of elastic arms. The spacer has a plurality of thru-holes and is sandwiched between the testing circuit board and the signal transmission board. The metal pads respectively face the internal pads through the thru-holes, and each of the metal pads is spaced apart from the corresponding internal pad by a distance. Each of the elastic arms has a fixing portion and a curved portion extending from the fixing portion. A height of the curved portion of each of the elastic arms in the thickness direction is smaller than the distance, and is larger than a depth of each of the thru-holes in the thickness direction. The fixing portions of the elastic arms are fixed on the spacer, the curved portions of the elastic arms are respectively arranged in the thru-holes, and each of the curved portions is elastically deformed by being detachably pressed between one of the metal pads and the corresponding internal pad so as to provide an electrical transmission path. The probe head is disposed on the top surface of the signal transmission board, and the probe head includes a retainer and a plurality of conductive probes. The conductive probes are inserted into and positioned by the retainer. One end of each of the conductive probes passes through the retainer and abuts against the top surface of the signal transmission board, and the other end of the each of the conductive probes passes through the retainer and is configured to contact a device under test (DUT).

In certain embodiments, the electrically connecting module includes a metal sheet and at least one insulating layer, the metal sheet is disposed on the spacer and has a plurality of openings, the elastic arms respectively correspond in position to the openings, and each of the elastic arms is spaced apart from the metal sheet, and wherein the fixing portion of each of the elastic arms and the metal sheet are located on a plane, and the at least one insulating layer connects the fixing portions to the metal sheet.

In one aspect, the present disclosure provides a testing device, which includes a testing circuit board, a signal transmission board, and an electrically connecting module. The testing circuit board includes a plurality of metal pads spaced apart from each other. The testing circuit board is configured to be electrically coupled to a testing machine. The signal transmission board has a top surface and a bottom surface opposite to the top surface. The bottom surface of the signal transmission board faces the testing circuit board along a thickness direction, and the signal transmission board includes a plurality of internal pads arranged on the bottom surface thereof. The electrically connecting module is sandwiched between the testing circuit board and the signal transmission board, and the electrically connecting module includes a spacer and a plurality of elastic arms. The spacer is sandwiched between the testing circuit board and the signal transmission board. The metal pads respectively face the internal pads, and each of the metal pads is spaced apart from the corresponding internal pad by a distance. Each of the elastic arms has a fixing portion and a curved portion extending from the fixing portion. A height of the curved portion of each of the elastic arms in the thickness direction is smaller than the distance, and is larger than a thickness of the spacer in the thickness direction. The fixing portions of the elastic arms are fixed on the spacer, and each of the curved portions is elastically deformed by being detachably pressed between one of the metal pads and the corresponding internal pad so as to provide an electrical transmission path.

In certain embodiments, the internal pads are exposed from the top surface of the signal transmission board, and are configured to be soldered with a device under test.

Therefore, each of the probe card testing device and the testing device of the present disclosure uses the elastic arms to establish an electrical connection between the signal transmission board and the testing circuit board without any soldering material, so that each of the probe card testing device and the testing device can be effectively avoided being damaged by thermal shock.

Moreover, since the elastic arm is detachably abutted against the internal pad of the signal transmission board and the metal pad of the testing circuit board, the signal transmission board and the testing circuit board can be easily disassembled from each other for inspection and repair.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
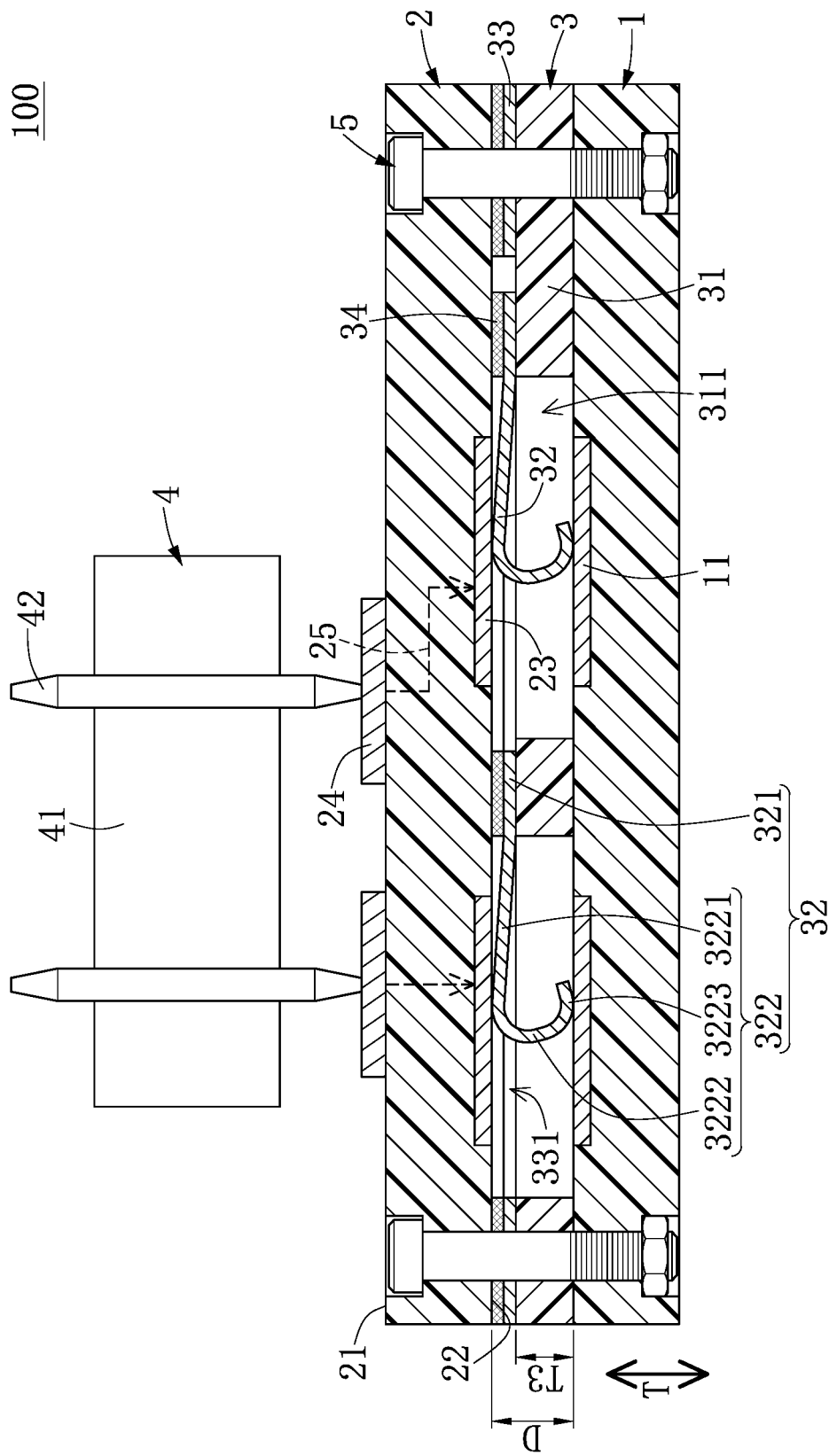
FIG. 1 is a cross-sectional view of a probe card testing device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a probe card testing device 100. As shown in FIG. 1, the probe card testing device 100 includes a testing circuit board 1, a signal transmission board 2 facing the testing circuit board 1, an electrically connecting module 3 sandwiched between the testing circuit board 1 and the signal transmission board 2, a probe head 4 disposed on the signal transmission board 2, and a screw assembly 5. The testing circuit board 1, the electrically connecting module 3, the signal transmission board 2, and the probe head 4 in the present embodiment are sequentially stacked along a thickness direction T, but the present disclosure is not limited thereto.

It should be noted that, the screw assembly 5 of the probe card testing device 100 of the present embodiment passes through and assembles the testing circuit board 1, the electrically connecting module 3, and the signal transmission board 2, so that the relative position of the testing circuit board 1, the electrically connecting module 3, and the signal transmission board 2 with respect to a thickness direction T can be maintained by the screw assembly 5. In other words, the testing circuit board 1, the electrically connecting module 3, and the signal transmission board 2 in the present embodiment can be fixed to each other without being soldered. Moreover, any electrical connection between the testing circuit board 1 and the signal transmission board 2 is not established by a soldering material.

In other embodiments of the present disclosure, the screw assembly 5 can pass through and assemble the testing circuit board 1, the electrically connecting module 3, the signal transmission board 2, and the probe head 4 together, so that the testing circuit board 1, the electrically connecting module 3, the signal transmission board 2, and the probe head 4 can be fixed to each other without being soldered. Moreover, the probe card testing device 100 can replace the function of the screw assembly 5 with other manners, for example, adhering the components of the probe card testing device 100 to each other.

In addition, the probe card testing device 100 of the present embodiment preferably excludes any testing device without the probe head 4, but the present disclosure is not limited thereto. The following description discloses the structure and connection relationship of each component of the probe card testing device 100.

Figure 2:
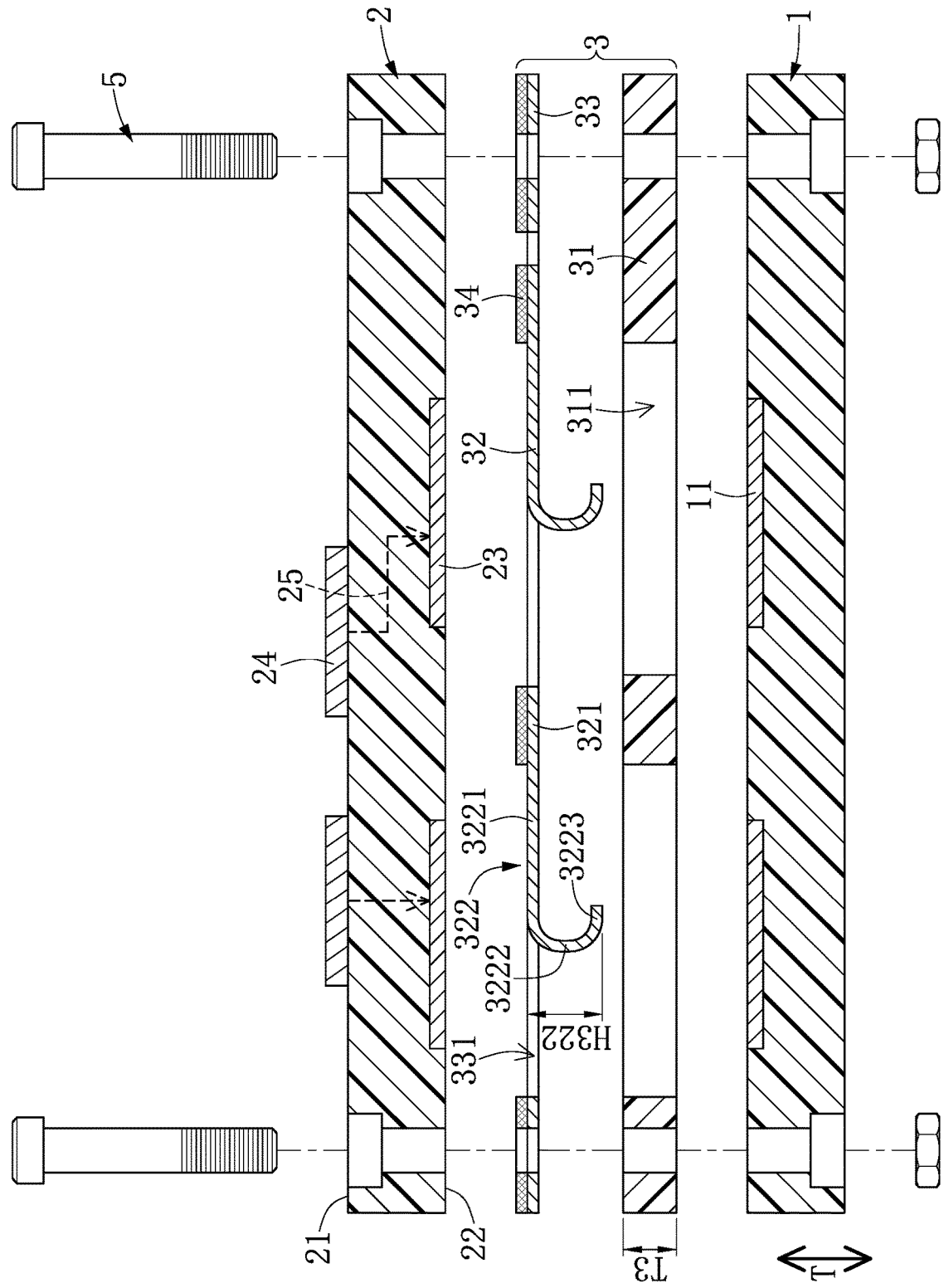
FIG. 2 is an exploded view of FIG. 1 when a probe head is omitted.
Figure 3:
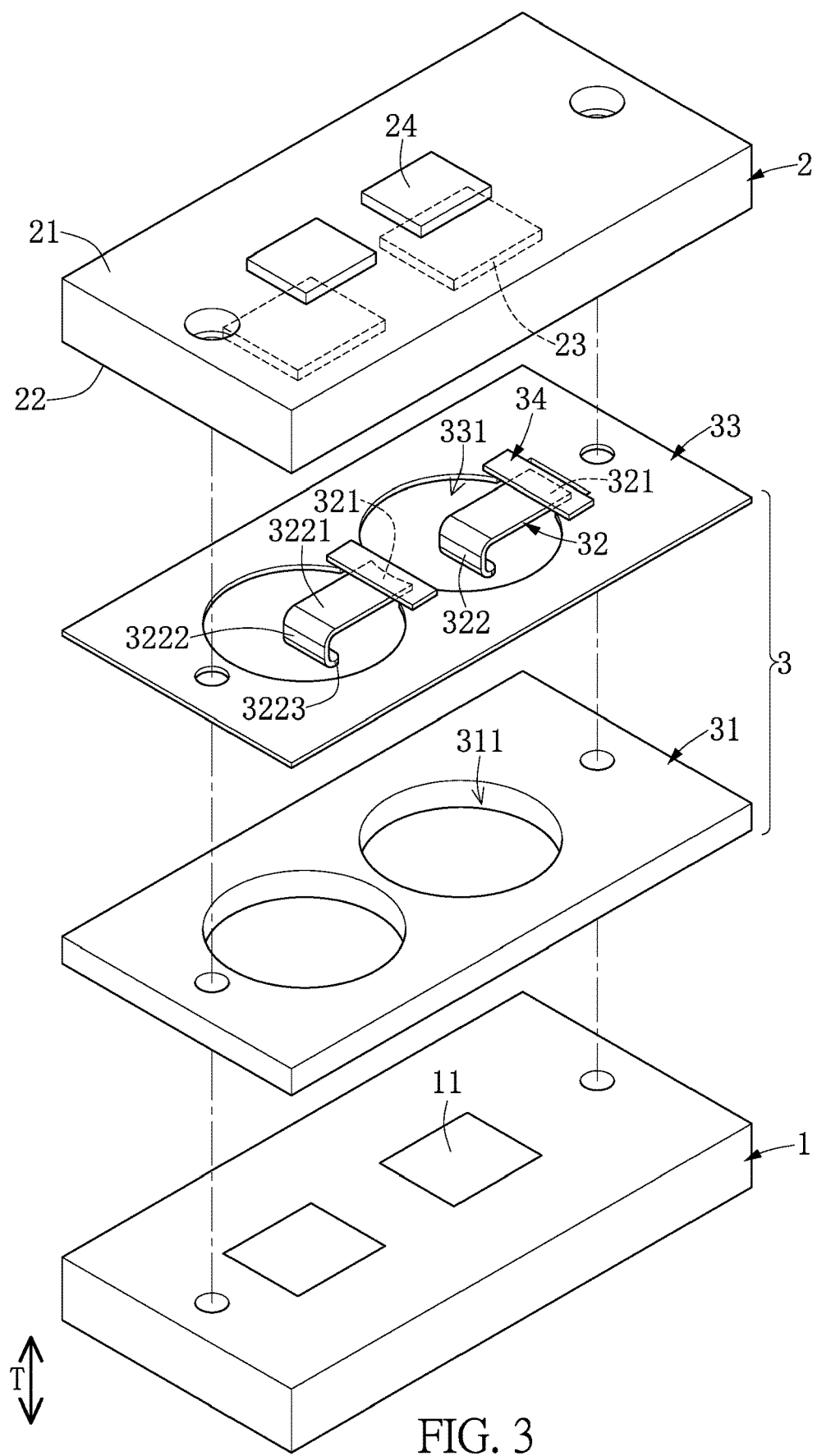
FIG. 3 is a perspective view of FIG. 2 when the probe head and a screw assembly are omitted.
Figure 4:
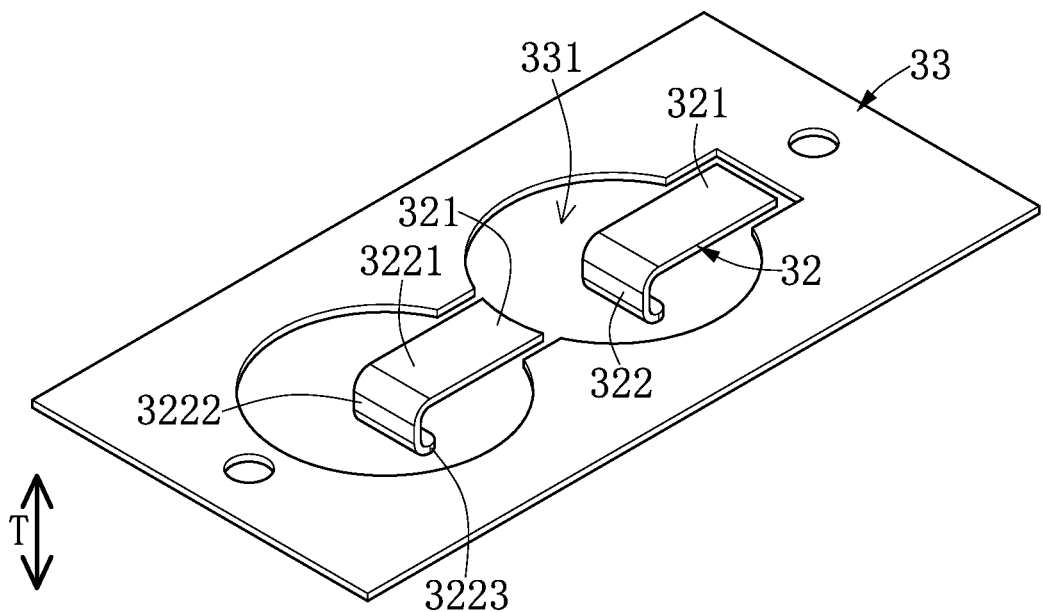
FIG. 4 is a perspective view showing a metal sheet and elastic arms.
Figure 5:
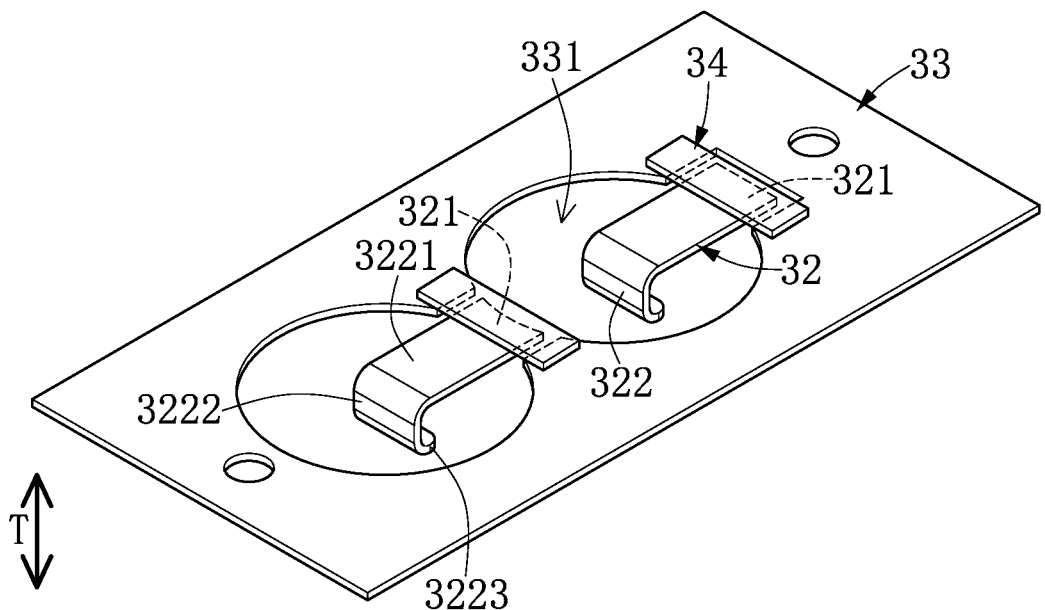
FIG. 5 is a perspective view showing the metal sheet, the elastic arms, and an insulating layer.
Figure 6:
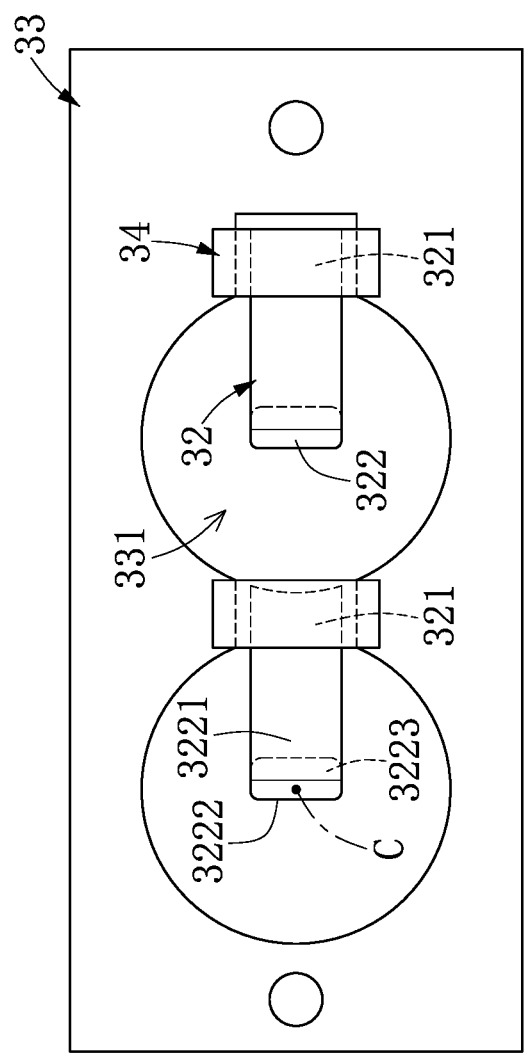
FIG. 6 is a top view of FIG. 5.

As shown in FIG. 2 and FIG. 3, the testing circuit board 1 includes a plurality of metal pads 11 spaced apart from each other and arranged on a surface thereof (e.g., a top surface of the testing circuit board 1 shown in FIG. 1), and the testing circuit board 1 is configured to electrically coupled to a testing machine (not shown). In other words, since the testing circuit board 1 is electrically coupled to the testing machine, the testing machine can receive and analyze signals transmitted from the testing circuit board 1. The electrical connection between the testing circuit board 1 and the testing machine can be adjusted according to design requirements. For example, in other embodiments of the present disclosure, the testing circuit board 1 can be directly integrated (or formed) in the testing machine.

As shown in FIG. 2 and FIG. 3, the signal transmission board 2 has a top surface 21 and a bottom surface 22 opposite to the top surface 21 thereof, and the bottom surface 22 of the signal transmission board 2 faces the testing circuit board 1 along the thickness direction T. The signal transmission board 2 includes a plurality of internal pads 23 arranged on the bottom surface 22 thereof, and the arrangement of the internal pads 23 is substantially identical to that of the metal pads 11 of the testing circuit board 1. It should be noted that, the shape of the internal pad 23 in the present embodiment is a square, but the present disclosure is not limited thereto. In other embodiments of the present disclosure, the shape of the internal pad 23 can be a circle, a rectangle, or in other shapes.

Moreover, the signal transmission board 2 includes a plurality of external pads 24 arranged on the top surface 21 thereof, and the external pads 24 are respectively and electrically coupled to the internal pads 23. Specifically, the signal transmission board 2 includes a plurality of conductive circuits 25 arranged therein for transmitting signal along the thickness direction T. The external pads 24 are respectively and electrically connected to the internal pad 23 through the conductive circuits 25. A distance between two of the external pads 24 adjacent to each other is preferably smaller than a distance between the two corresponding internal pads 23. In other words, the signal transmission board 2 in the present embodiment includes a signal fan-out structure, but the present disclosure is not limited thereto.

As shown in FIG. 3 to FIG. 6, the electrically connecting module 3 includes a sheet-like spacer 31, a plurality of elastic arms 32, a metal sheet 33, and at least one insulating layer 34. It should be noted that, the electrically connecting module 3 in the present embodiment is provided with the spacer 31 and the elastic arms 32 to cooperate with the metal sheet 33 and the at least one insulating layer 34, but the present disclosure is not limited thereto. For example, in other embodiments of the present disclosure, the metal sheet 33 and the at least one insulating layer 34 can be omitted or can be replaced by other components.

The spacer 31 has a plurality of thru-holes 311, and each of the thru-holes 311 in the present embodiment penetrates through the spacer 31 along the thickness direction T. The spacer 31 is sandwiched between the testing circuit board 1 and the signal transmission board 2, and the metal pads 11 respectively face the internal pads 23 through the thru-holes 311. In other words, two opposite sides of each of the thru-holes 311 (e.g., the lower side and the upper side of each of the thru-holes 311 shown in FIG. 1) respectively correspond in position to one of the metal pads 11 and one of the internal pads 23.

As shown in FIG. 1, each of the metal pads 11 is spaced apart from the corresponding internal pad 23 by a distance D, and the distance D in the present embodiment is approximately equal to (e.g., slightly larger than) a thickness T3 of the spacer 31 in the thickness direction T, but the present disclosure is not limited thereto. For example, in other embodiments of the present disclosure, the metal pad 11 or the internal pad 23 can be partially arranged in the corresponding thru-hole 311, and the distance D is smaller than the thickness T3 of the spacer 31.

As shown in FIG. 3 to FIG. 6, the elastic arms 32 and the metal sheet 33 in the present embodiment are formed by punching and bending a copper sheet, and each of the elastic arms 32 is spaced apart from the metal sheet 33, but the present disclosure is not limited thereto. Each of the elastic arms 32 is integrally formed as a single piece, and has Vickers hardness that is preferably more than 350 Hv and Young's modulus that is preferably more than 120 GPa.

Specifically, each of the elastic arms 32 includes a fixing portion 321 and a curved portion 322 extending from the fixing portion 321. The fixing portion 321 of each of the elastic arms 32 and the metal sheet 33 are located on a plane. That is to say, the fixing portion 321 of each of the elastic arms 32 is coplanar with the metal sheet 33. In each of the elastic arms 32, the curved portion 322 includes an arm segment 3221 extending from the fixing portion 321, a connecting segment 3222 curvedly extending from the arm segment 3221, and a free end segment 3223 curvedly extending from the connecting segment 3222. The extending direction (e.g., a counterclockwise direction of FIG. 4) of the connecting segment 3222 is equal to that of the free end segment 3223, but the present disclosure is not limited thereto.

Moreover, each of the elastic arms 32 is in a J-shape when not being pressed. A height H322 of the curved portion 322 of each of the elastic arms 32 in the thickness direction T is smaller than the distance D, and is larger than a depth T3 (or the thickness T3 of the spacer 31) of each of the thru-holes 311 in the thickness direction T.

As shown in FIG. 3 to FIG. 6, the metal sheet 33 is disposed on the spacer 31 and has a plurality of openings 331. Inner walls of the metal sheet 33 defining the openings 331 in the present embodiment are respectively flush with inner walls of the spacer 31 defining the thru-holes 311 along the thickness direction T, but the present disclosure is not limited thereto. The elastic arms 32 respectively correspond in position to the openings 331 of the metal sheet 33, the fixing portion 321 of each of the elastic arms 32 is spaced apart from the metal sheet 33, and the at least one insulating layer 34 connects the fixing portions 321 to the metal sheet 33.

Specifically, in at least one of the elastic arms 32 of the present embodiment (e.g., the left elastic arm 32 shown in FIG. 6), the fixing portion 321 is arranged between two of the openings 331 adjacent to each other, the curved portion 322 is partially arranged in one of the two adjacent openings 331, and an edge of the fixing portion 321 (e.g., the right edge of the left elastic arm 32 shown in FIG. 6) away from the curved portion 322 defines a part of the other opening 331.

In other words, when the elastic arms 32 are orthogonally projected onto the plane along the thickness direction T, a projected region of the curved portion 322 of each of the elastic arms 32 preferably covers a center point C of the corresponding opening 331, but the present disclosure is not limited thereto.

Moreover, the fixing portions 321 of the elastic arms 32 are fixed on the spacer 31. In the present embodiment, the fixing portion 321 of each of the elastic arms 32 is fixed to the metal sheet 33 by the insulating layer 34, and is sandwiched between the spacer 31 and the bottom surface 22 of the signal transmission board 2, but the present disclosure is not limited thereto. For example, in other embodiments of the present disclosure, the fixing portion 321 of each of the elastic arms 32 can be sandwiched between the spacer 31 and the testing circuit board 1.

Specifically, the curved portions 322 of the elastic arms 32 are respectively arranged in the thru-holes 311 of the spacer 31, and each of the curved portions 322 is elastically deformed by being detachably pressed between one of the metal pads 11 and the corresponding internal pad 23 so as to provide an electrical transmission path. In other words, since the height H322 of the curved portion 322 is smaller than the distance D between the metal pad 11 and the internal pad 23, the curved portion 322 can be pressed to have an elastic deformation. Accordingly, the curved portion 322 can be stably abutted against the metal pad 11 and the internal pad 23.

In the present embodiment, the curved portion 322 of the elastic arm 32 abuts against the metal pad 11 through the free end segment 3223, and abuts against the internal pad 23 through the connecting segment 3222, but the present disclosure is not limited thereto. For example, in other embodiments of the present disclosure, the curved portion 322 of the elastic arm 32 can abut against the internal pad 23 through the free end segment 3223, and can abut against the metal pad 11 through the connecting segment 3222. Moreover, the elastic arm 32 can further include a dome (not shown) formed on a surface of the free end segment 3223 away from the arm segment 3221, and the elastic arm 32 can abut against the internal pad 23 or the metal pad 11 through the dome.

As shown in FIG. 1, the probe head 4 is disposed on the top surface 21 of the signal transmission board 2, and is electrically coupled to the testing circuit board 1 through the signal transmission board 2 and the electrically connecting module 3. The probe head 4 includes a retainer 41 and a plurality of conductive probes 42 that are inserted into and positioned by the retainer 41. One end (e.g., the bottom end) of each of the conductive probes 42 passes through a top surface of the retainer 41 and abuts against the top surface 21 of the signal transmission board 2, and the other end (e.g., the top end) of each of the conductive probes 42 passes through a bottom surface of the retainer 41 and is configured to contact a device under test (e.g., a semi-conductor wafer).

It should be noted that, the conductive probe 42 in the present embodiment is an elongated and flexible structure having an electrically conductive property, and the conductive probe 42 can be a rectangular probe, a round probe, or other probes.

Second Embodiment

Figure 7:
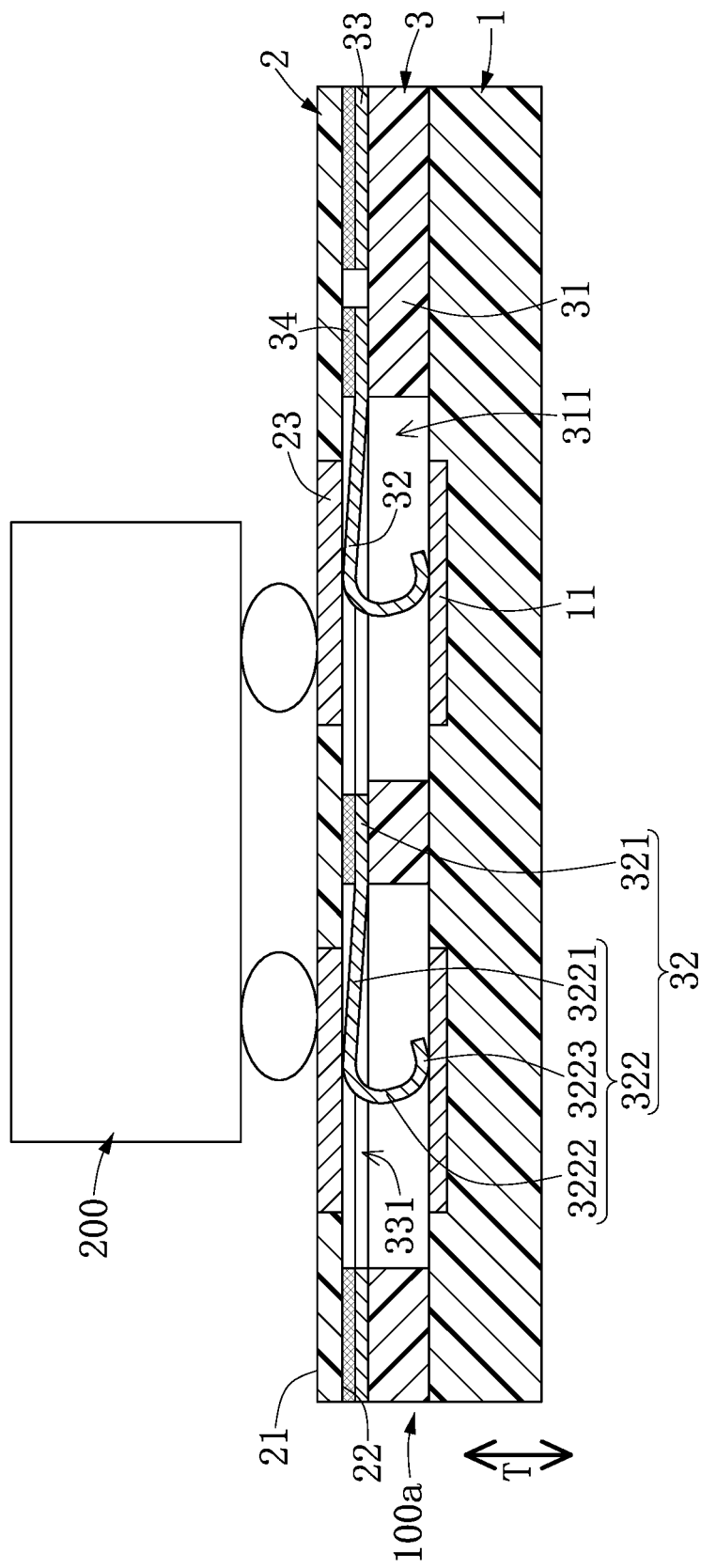
FIG. 7 is a cross-sectional view of a testing device according to a second embodiment of the present disclosure.
Figure 8:
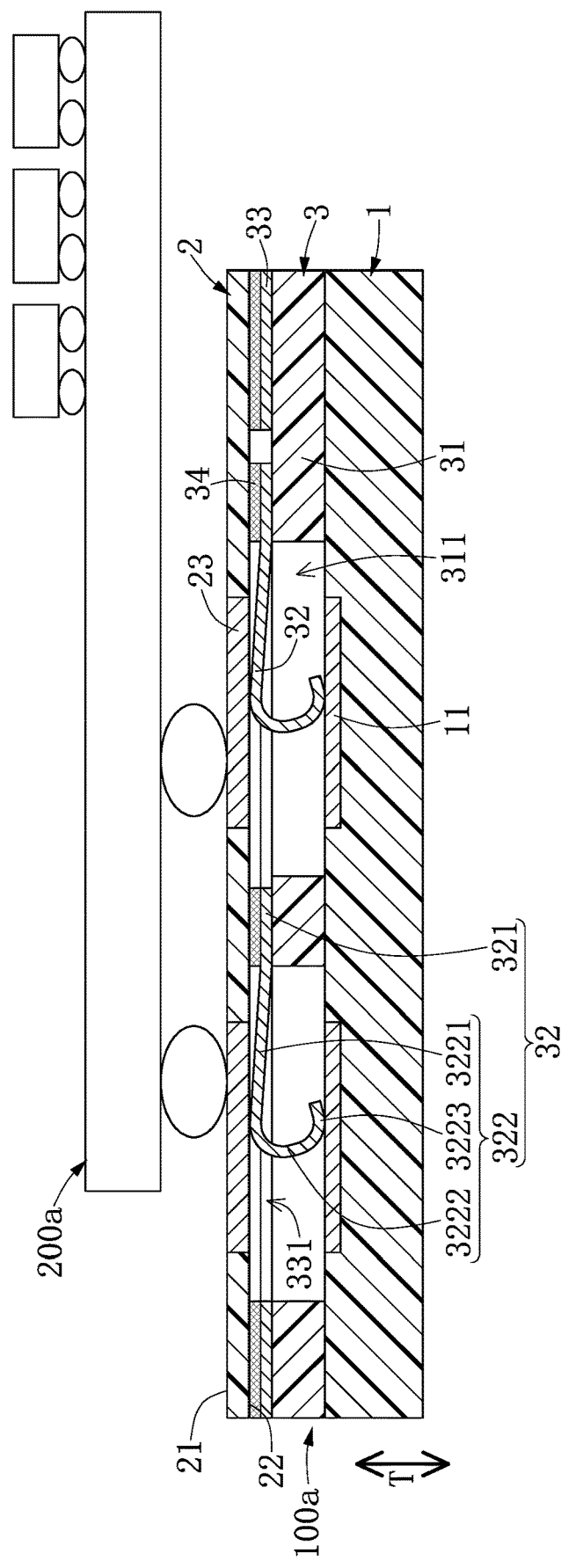
FIG. 8 is a cross-sectional view of the testing device in another configuration according to the second embodiment of the present disclosure.
Figure 9:
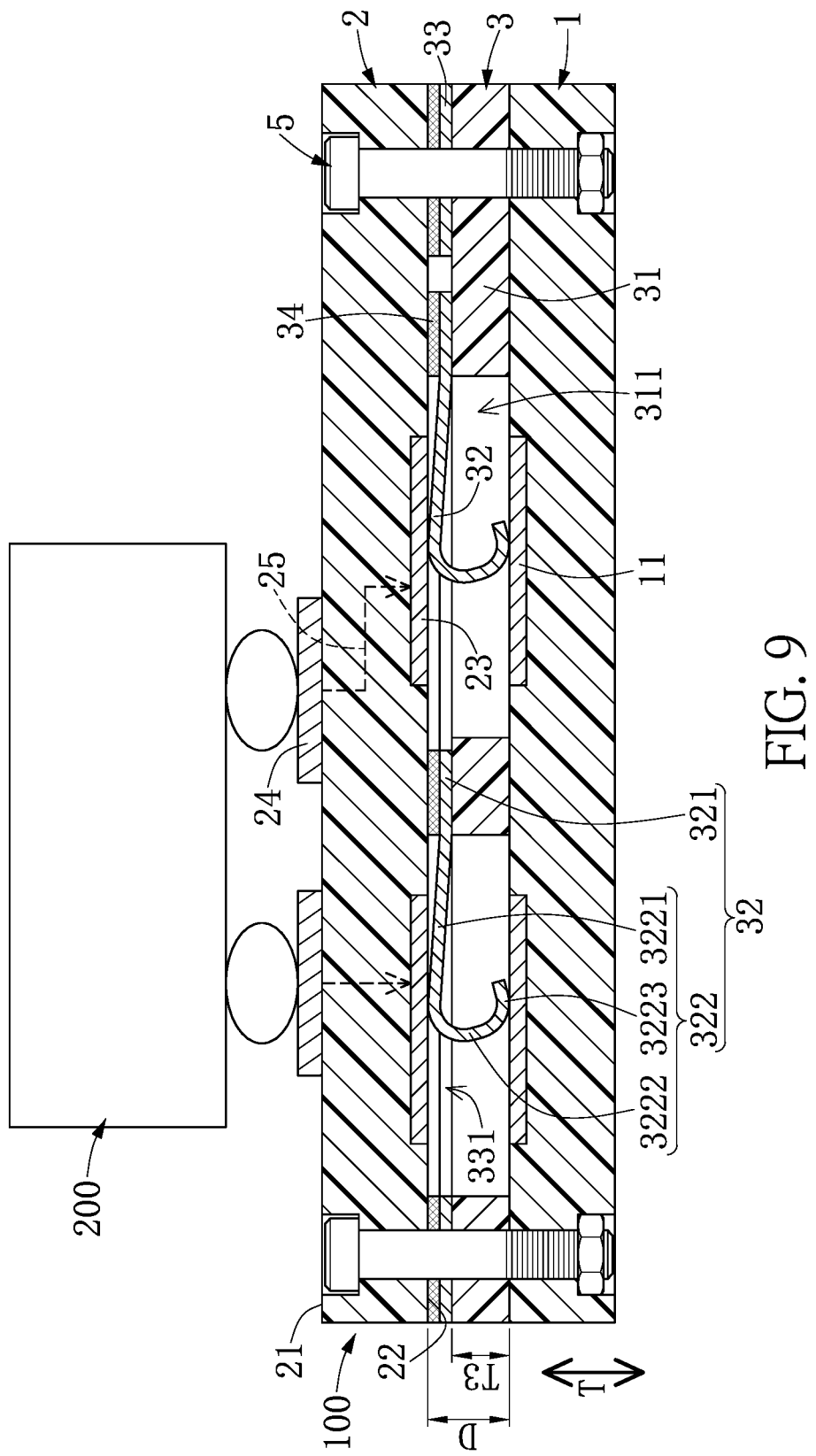
FIG. 9 is a cross-sectional view of the testing device in yet another configuration according to the second embodiment of the present disclosure.

Referring to FIG. 7 to FIG. 9, a second embodiment of the present disclosure provides a testing device 100a. The present embodiment is similar to the first embodiment, and the difference between the two embodiments is disclosed as follows.

As shown in FIG. 7 and FIG. 8, the testing device 100a of the present embodiment includes a testing circuit board 1, a signal transmission board 2 facing the testing circuit board 1, and an electrically connecting module 3 sandwiched between the testing circuit board 1 and the signal transmission board 2. The testing circuit board 1 and the electrically connecting module 3 of the present embodiment are similar to that of the first embodiment.

The signal transmission board 2 has a top surface 21 and a bottom surface 22 opposite to the top surface 21 thereof, and the bottom surface 22 of the signal transmission board 2 faces the testing circuit board 1 along the thickness direction T. The signal transmission board 2 includes a plurality of internal pads 23, and two opposite sides (the top side and the bottom side) of each of the internal pads 23 are respectively exposed from the top surface 21 and the bottom surface 22 of the signal transmission board 2. Specifically, the top sides of the internal pads 23 exposed from the top surface 21 are configured to be soldered with a device under test 200, 200a, and the bottom sides of the internal pads 23 exposed from the bottom surface 22 are respectively abutted against the curved portions 322 of the elastic arms 32.

Moreover, the device under test 200, 200a can be a single electronic component as shown in FIG. 7, or can be a combination having a board and electronic components mounted on the board as shown in FIG. 8, but the present disclosure is not limited thereto.

In addition, as shown in FIG. 9, the signal transmission board 2 of the present embodiment can be similar to that of the first embodiment, and the external pads 24 can be configured to be soldered with a device under test 200.

In conclusion, each of the probe card testing device 100 and the testing device 100a of the present disclosure uses the elastic arms 32 to establish an electrical connection between the signal transmission board 2 and the testing circuit board 1 without any soldering material, so that each of the probe card testing device 100 and the testing device 100a can avoid being damaged by thermal shock.

Moreover, since the elastic arm 32 is detachably abutted against the internal pad 23 of the signal transmission board 2 and the metal pad 11 of the testing circuit board 1, the signal transmission board 2 and the testing circuit board 1 can be easily disassembled from each other for inspection and repair.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card testing device, comprising:
   a testing circuit board including a plurality of metal pads spaced apart from each other, wherein the testing circuit board is configured to be electrically coupled to a testing machine;
   a signal transmission board having a top surface and a bottom surface opposite to the top surface, wherein the bottom surface of the signal transmission board faces the testing circuit board along a thickness direction, and the signal transmission board includes a plurality of internal pads arranged on the bottom surface thereof;
   an electrically connecting module sandwiched between the testing circuit board and the signal transmission board, and the electrically connecting module including:
      a spacer having a plurality of thru-holes and sandwiched between the testing circuit board and the signal transmission board, wherein the metal pads respectively face the internal pads through the thru-holes, and each of the metal pads is spaced apart from the corresponding internal pad by a distance; and
      a plurality of elastic arms each having a fixing portion and a curved portion extending from the fixing portion, wherein a height of the curved portion of each of the elastic arms in the thickness direction is smaller than the distance, and is larger than a depth of each of the thru-holes in the thickness direction, wherein the fixing portions of the elastic arms are fixed on the spacer, the curved portions of the elastic arms are respectively arranged in the thru-holes, and each of the curved portions is elastically deformed by being detachably pressed between one of the metal pads and the corresponding internal pad so as to provide an electrical transmission path; and a probe head disposed on the top surface of the signal transmission board, and the probe head including:
 a retainer; and
 a plurality of conductive probes inserted into and positioned by the retainer, wherein one end of each of the conductive probes passes through the retainer and abuts against the top surface of the signal transmission board, and the other end of each of the conductive probes passes through the retainer and is configured to contact a device under test (DUT).

2. The probe card testing device according to claim 1, wherein each of the elastic arms is integrally formed as a single piece; in each of the elastic arms, the curved portion includes an arm segment extending from the fixing portion, a connecting segment curvedly extending from the arm segment, and a free end segment curvedly extending from the connecting segment, and the extending direction of the connecting segment is equal to that of the free end segment.

3. The probe card testing device according to claim 1, wherein the electrically connecting module includes a metal sheet and at least one insulating layer, the metal sheet is disposed on the spacer and has a plurality of openings, the elastic arms respectively correspond in position to the openings, and each of the elastic arms is spaced apart from the metal sheet, and wherein the fixing portion of each of the elastic arms and the metal sheet are located on a plane, and the at least one insulating layer connects the fixing portions to the metal sheet.

4. The probe card testing device according to claim 3, wherein inner walls of the metal sheet defining the openings are respectively flush with inner walls of the spacer defining the thru-holes along the thickness direction.

5. The probe card testing device according to claim 3, wherein when the elastic arms are orthogonally projected onto the plane along the thickness direction, a projected region of the curved portion of each of the elastic arms covers a center point of the corresponding opening.

6. The probe card testing device according to claim 3, wherein in at least one of the elastic arms, the fixing portion is arranged between two of the openings adjacent to each other, the curved portion is partially arranged in one of the two adjacent openings, and an edge of the fixing portion away from the curved portion defines a part of the other opening.

7. The probe card testing device according to claim 1, further comprising a screw assembly passing through the testing circuit board, the electrically connecting module, and the signal transmission board, wherein the relative position of the testing circuit board, the electrically connecting module, and the signal transmission board with respect to the thickness direction is maintained by the screw assembly, and any electrical connection between the testing circuit board and the signal transmission board is not established by a soldering material.

8. The probe card testing device according to claim 1, wherein each of the elastic arms has Vickers hardness more than 350 Hv and Young's modulus more than 120 GPa.

9. A testing device, comprising:
 a testing circuit board including a plurality of metal pads spaced apart from each other, wherein the testing circuit board is configured to be electrically coupled to a testing machine;
 a signal transmission board having a top surface and a bottom surface opposite to the top surface, wherein the bottom surface of the signal transmission board faces the testing circuit board along a thickness direction, and the signal transmission board includes a plurality of internal pads arranged on the bottom surface thereof; and
 an electrically connecting module sandwiched between the testing circuit board and the signal transmission board, and the electrically connecting module including:
  a spacer sandwiched between the testing circuit board and the signal transmission board, wherein the metal pads respectively face the internal pads, and each of the metal pads is spaced apart from the corresponding internal pad by a distance; and
  a plurality of elastic arms each having a fixing portion and a curved portion extending from the fixing portion, wherein a height of the curved portion of each of the elastic arms in the thickness direction is smaller than the distance, and is larger than a thickness of the spacer in the thickness direction,
  wherein the fixing portions of the elastic arms are fixed on the spacer, and each of the curved portions is elastically deformed by being detachably pressed between one of the metal pads and the corresponding internal pad so as to provide an electrical transmission path.

10. The testing device according to claim 9, wherein the internal pads are exposed from the top surface of the signal transmission board, and are configured to be soldered with a device under test.

* * * * *